United States Patent [19]

Imai et al.

[11] Patent Number: 4,996,686

[45] Date of Patent: * Feb. 26, 1991

[54] CHARGE TRANSFER DEVICE WITH RESET VOLTAGE GENERATING CIRCUIT

[75] Inventors: Shin-ichi Imai; Tatsuya Yoshie, both of Yokohama, Japan

[73] Assignee: Kabushiki Kaisha Toshiba, Kawasaki, Japan

[*] Notice: The portion of the term of this patent subsequent to Dec. 26, 2006 has been disclaimed.

[21] Appl. No.: 196,532

[22] Filed: May 20, 1988

[30] Foreign Application Priority Data

May 21, 1987 [JP] Japan ............................ 62-124611
Feb. 12, 1988 [JP] Japan ............................ 63-30418

[51] Int. Cl.⁵ .................... H01L 29/78; G11C 19/28
[52] U.S. Cl. .................................... 377/60; 377/58; 357/24; 307/530; 307/578
[58] Field of Search ........................ 377/57–63; 307/358, 359, 350, 607, 530, 482, 577, 578; 357/24

[56] References Cited

U.S. PATENT DOCUMENTS

| 4,451,744 | 5/1984 | Adam ............................... 307/296.6 |
| 4,482,825 | 11/1984 | Nozaki et al. ...................... 307/530 |
| 4,627,083 | 2/1986 | Pelgrom et al. ...................... 377/60 |
| 4,636,664 | 1/1987 | Craycraft et al. ................... 307/530 |
| 4,771,194 | 9/1988 | Van Zeghbroeck ................ 307/530 |
| 4,809,307 | 2/1989 | Sakaue et al. ........................ 377/60 |
| 4,890,307 | 12/1989 | Imai et al. ............................ 377/60 |

FOREIGN PATENT DOCUMENTS

| 0191583 | 2/1986 | European Pat. Off. |
| 0192142 | 2/1986 | European Pat. Off. |
| 0199387 | 3/1986 | European Pat. Off. |
| 0000963 | 1/1984 | Japan .................................. 357/24 |
| 0011680 | 1/1984 | Japan .................................. 357/24 |
| 0229834 | 12/1984 | Japan .................................. 357/24 |
| 0091671 | 5/1985 | Japan .................................. 357/24 |

OTHER PUBLICATIONS

1971 IEEE International Solid-State Circuits Conference, Digest of Technical Papers, Feb. 17–19, 1971, vol. 14, pp. 162–163, 203, W. F. Kosonocky et al.: "Charge-coupled Digital Circuits."
Japanese Patent Disclosure (KOKAI) No. 59-132668, Imai, Jul. 30, 1984.
Japanese Patent Disclosure (KOKAI) No. 61-216473, Kimata, Sep. 26, 1986.

*Primary Examiner*—John S. Heyman
*Assistant Examiner*—Tai V. Duong
*Attorney, Agent, or Firm*—Finnegan, Henderson, Farabow, Garrett, and Dunner

[57] ABSTRACT

In a charge transfer device, a voltage generating cirucit generates a voltage amounting to a potential lower by "α" (α: a predetermined potential) than a potential formed under a reset gate electrode when stored charges of a floating diffusion region are discharged into a drain region. A voltage step-up circuit steps up a predetermined voltage and supplies the stepped-up voltage as a reset voltage to the drain region. A comparison/control circuit generates an error voltage amounting to a difference between the output voltage of the voltage generating circuit and the stepped-up voltage, and controls the voltage step-up operation by the step-up circuit according to the error voltage. With the structure of the device, the stepped-up voltage from the voltage step-up circuit, which is supplied as a reset voltage to the drain region, is controlled according to the process parameter variations. The result is that the reset voltage well follows up the process parameter variations, the dynamic range of the output signal is always kept wide, and the output signal of good linearity and good S/N performance can be obtained.

2 Claims, 9 Drawing Sheets

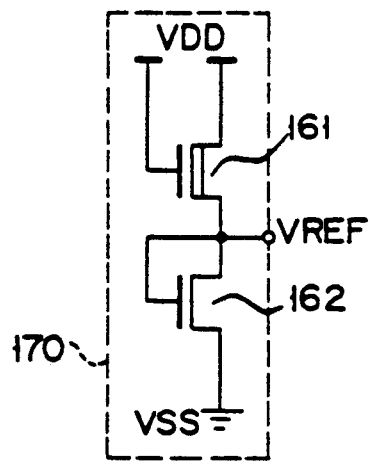
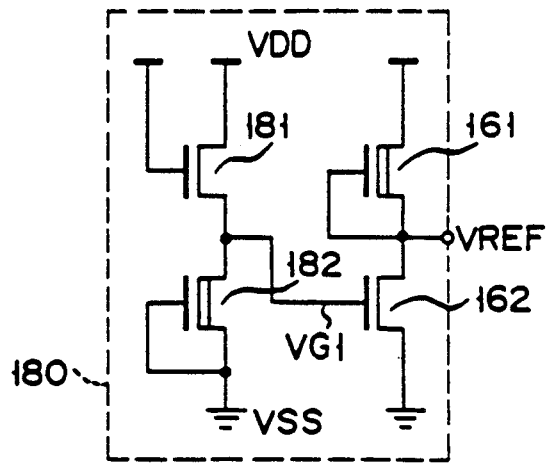
F I G. 11         F I G. 12
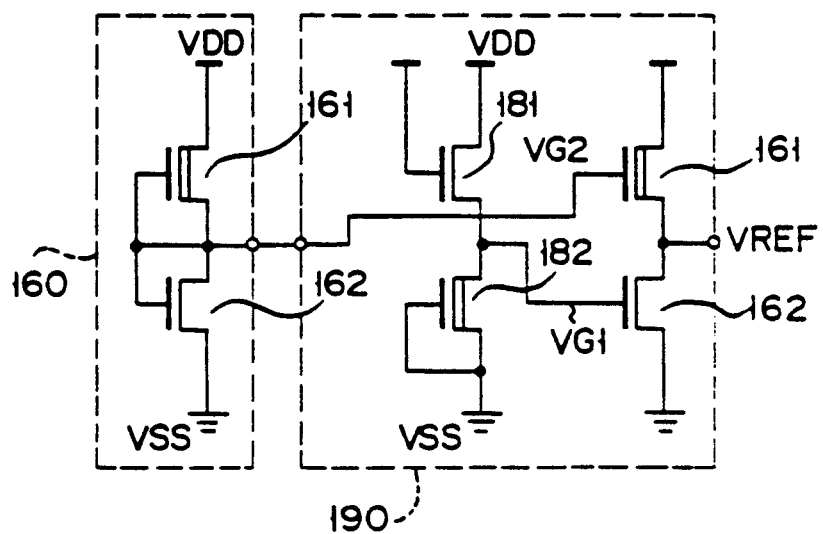
F I G. 13

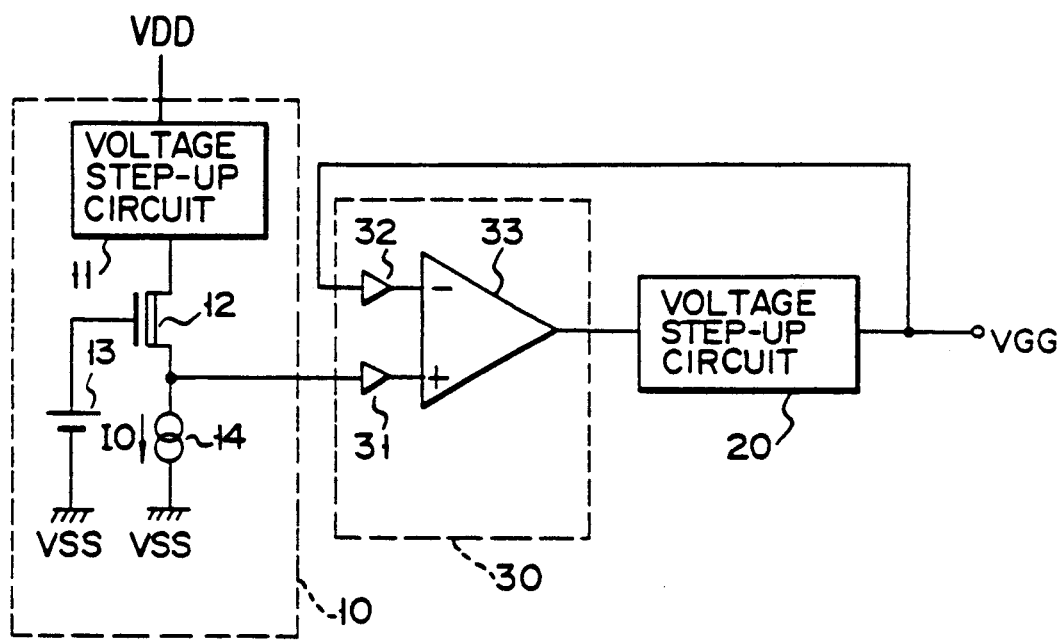
F I G. 14
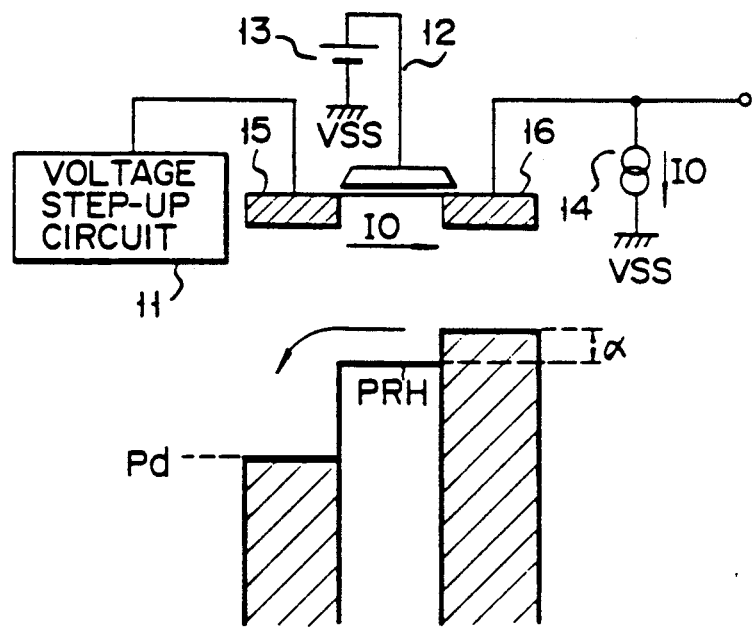
F I G. 15

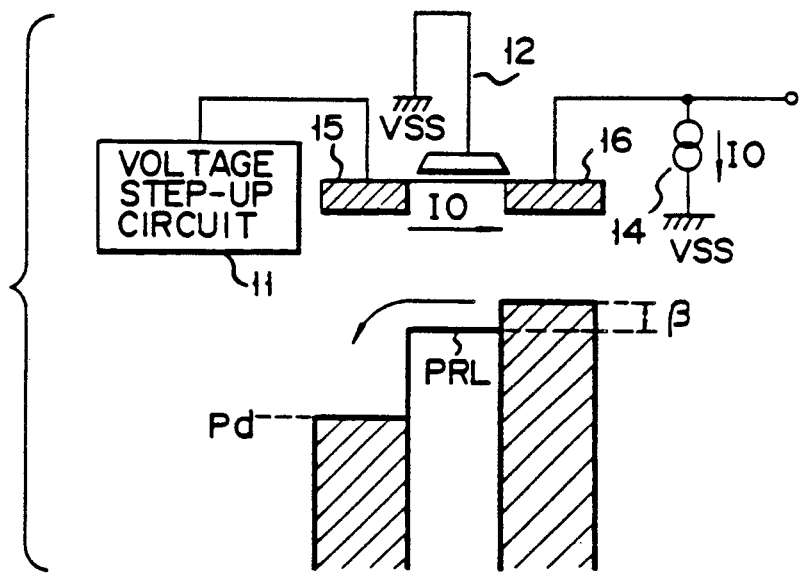
F I G. 18
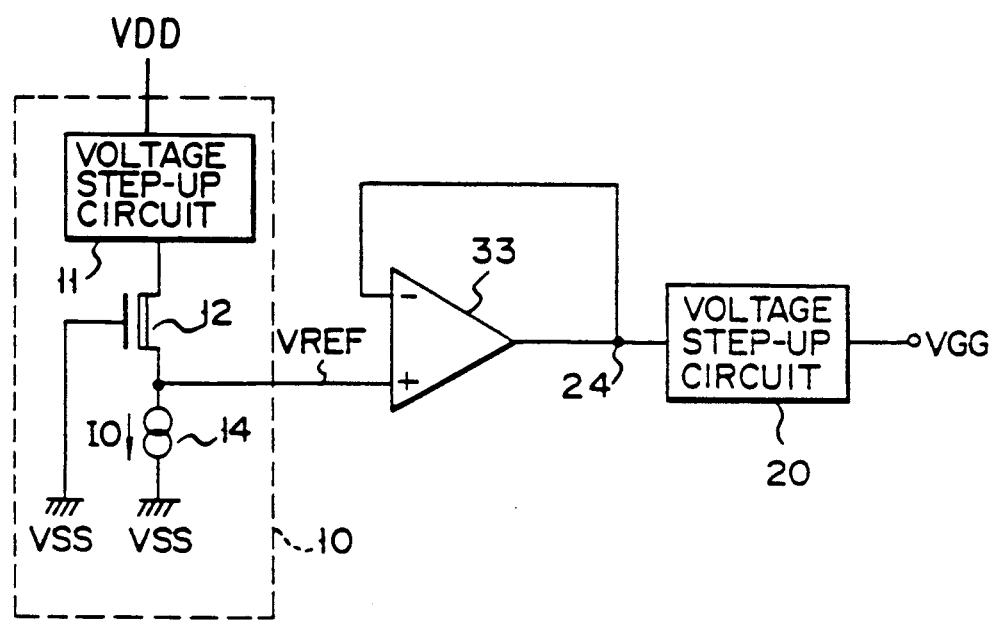
F I G. 19

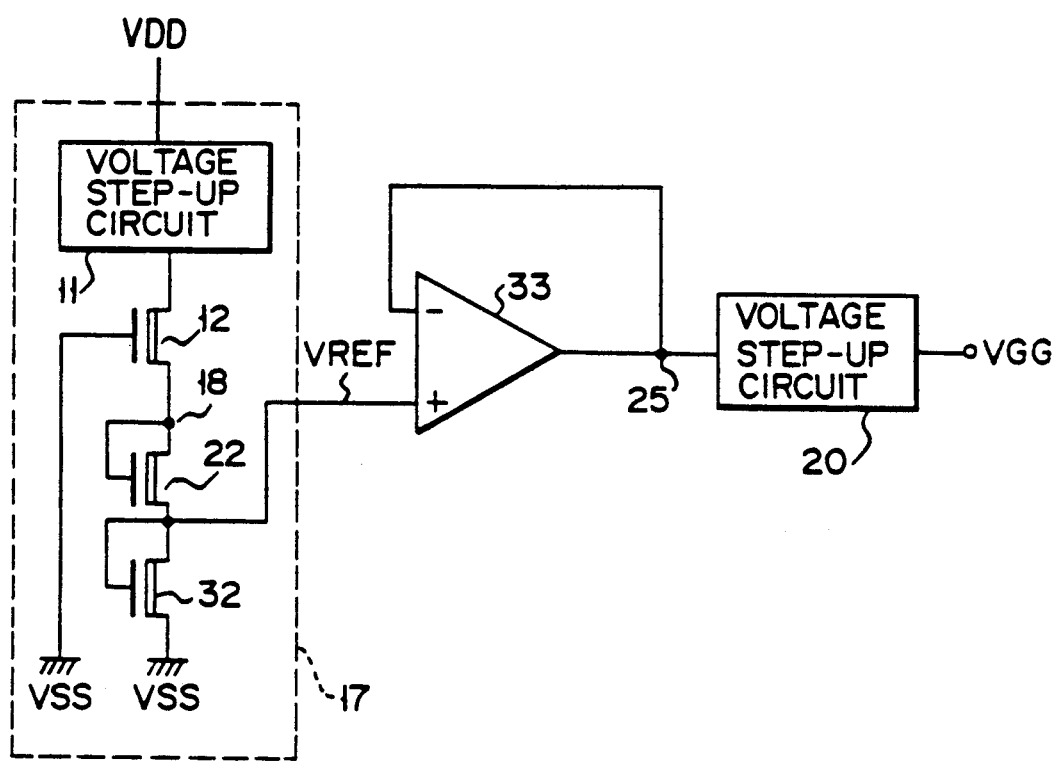
F I G. 20

CHARGE TRANSFER DEVICE WITH RESET VOLTAGE GENERATING CIRCUIT

BACKGROUND OF THE INVENTION

1. Field of the Invention

This invention relates to charge transfer devices used for image pick-up devices, and delay lines, comb filters, and transversal filters of the charge transfer type, and more particularly to the improvement of a portion of the charge transfer deviCe for applying a predetermined voltage to the drain region for draining unnecessary charges.

2. Description of the Related Art

There are various types of the signal output systems, which are employed in the output circuit of the charge transfer device (CTD) integrated on a semiconductor substrate. One of those signal output systems, which has been known, uses a floating diffusion region. In a known CTD employing this type of signal output system, a stepped-up voltage from a voltage step-up circuit is supplied to the drain region, in order to widen a dynamic range of the output signal. FIG. 1 shows a block diagram of an overall arrangement of a CTD with this voltage step-up circuit. FIG. 2 shows a sectional view of a part of the CTD when it is of the N channel buried type, for example. In FIGS. 1 and 2, reference numeral 41 designates an input terminal and 42 an output terminal. First power source terminal 43 is applied with the voltage of high potential power source VDD. Second power source terminal 44 is applied with the voltage of low potential power source VSS. Reference numeral 45 represents a P type semiconductor substrate. N⁻ type buried channel region 46 is formed on this substrate 45. An insulating film is designated by numeral 47. Input section 48 receives an analog signal applied through input terminal 41, and biases the analog signal by a predetermined DC voltage to convert it into signal charges. Charge transfer section 49 transfers the signal charges from this input section. Floating diffusion region 50 as an N type diffusion region is provided adjacent to output gate electrode 51 at the final stage of this charge transfer section 49. Drain region 52 as an N type diffusion region is applied with a predetermined potential. A reset gate electrode 53 is formed on insulating film 47 layered on a portion of the substrate, which is located between floating diffusion region 50 and drain region 52. Reset pulse φR, which varies between low and high voltages VRL and VRH, is applied to reset gate electrode 53. When reset pulse φR is at high voltage VRH, the storage charges in floating diffusion region 50 are discharged into drain region 52, through the semiconductor region under this reset gate electrode 53.

MOS transistor 54 is of the enhancement type (referred to as E type), and for charge detection. This transistor is so arranged that its gate is connected to floating diffusion region 50, its drain is connected to high potential power source VDD, and its source is connected to output terminal 42. Current source circuit 55 is made up of at least one MOS transistor. Circuit 55 is connected at one end to charge detecting MOS transistor 54, and at the other end to low potential power source VSS. This circuit 55 and MOS transistor 54 make up an output circuit 56 of the source follower type. Output circuit 56 converts the signal charges stored in floating diffusion region 50 into a voltage signal.

Charge transfer section 49 is a 2-phase drive CTD, which is driven by, for example, transfer clocks φ1 and φ2 of two phases. The 2-phase drive CTD has pairs of transfer electrodes 57$i$ and 58$i$ ($i$=1 to n) made of polysilicon layers. These paired electrodes are for setting the charge transfer direction. One pair of these electrodes are provided for each phase of drive pulse. Output gate electrode 51 coupled with bias voltage VB is provided at the final stage of the drive CTD. Voltage step-up circuit 59 is for stepping up a predetermined voltage. The stepped-up voltage is applied as reset voltage VGG to drain region 52. Normally, this voltage VGG is set to be higher than the voltage of high potential power source VDD.

The operation of the CTD thus arranged will be described referring to a potential profile of FIG. 3. Input section 48 converts an analog signal with a proper bias DC voltage into a quantity of signal charge, which depends on its analog signal level. The signal charge is transferred, by charge transfer section 49, into floating diffusion region 50, and stored therein. The stored charge Q (shown in FIG. 3) is detected by output circuit 56 at predetermined timings, and converted into a voltage signal. The voltage signal is output at output terminal 42. At this time, reset pulse φR is at low voltage VRL, and the potential PRL in the semiconductor region under reset gate electrode 53 electrically shuts off the path between the drain region 52 kept at reset voltage VGG level PD and floating diffusion region 50.

Then, when reset pulse φR is at high voltage VRH, the potential PRH under reset gate electrode 53 allows a current to pass the path between floating diffusion region 50 and drain region 52. As a result, the charge stored in floating diffusion region 50 is discharged as unnecessary charge into drain region 52 after passing the semiconductor region under reset gate electrode 53. Further, the potential in floating diffusion region 50 is reset to the value PD in drain region 52, which amounts to reset voltage VGG.

A dynamic range DR of the output signal, which is to be detected by output circuit 56 and converted into a voltage signal, is expressed by a difference (PD−PG) of the potential PD of drain region 52 and the potential PG of the semiconductor region under output gate electrode 51. Since reset voltage VGG is higher than the voltage of high potential power source VDD, the dynamic range DR of the output signal can be considerably large by selecting the applying voltage VB of output gate electrode 51 to be low as possible in connection with the potential PnL in the semiconductor region under final stage transfer electrode 58$n$.

If the reset voltage VGG in drain region 52 is higher than power source VDD voltage, the high reset voltage is applied to the gate of the MOS transistor 54 in output circuit 56 when floating diffusion region 50 is reset. Assuming that the gate voltage of transistor 54 at the time of signal detection is VG (VG≈VGG), a drain-source voltage is VDS, a gate-source voltage VGS, a threshold voltage is VTH, and a source voltage (at output terminal 42) is VO, we have $$VDS = VDD - VO \qquad (1)$$

$$GS - VTH = VG - VO - VTH \qquad (2)$$

To obtain a saturation operation of MOS transistor 54 at the time of signal detection, the following relation must be held $$VGS-VTH<VDS \quad (3)$$

Substituting the relation (1) into the relation (3), we have $$VG-VTH<VDD \quad (4)$$

In case where a good linearity is required for the output signal, it is necessary to select the voltages so as to satisfy the relation (4) when the signal is detected.

FIG. 4 shows a circuit diagram of a specific arrangement of voltage step-up circuit 59 used in the CTD. Control pulses CP and $\overline{CP}$ used in this circuit are illustrated by a timing chart of FIG. 6. The arrangement of the voltage step-up circuit shown in FIG. 9 is a modification of the FIG. 4 circuit. In FIG. 4, reference numeral 61 designates a reference voltage source for producing reference voltage VREF; 62 a MOS transistor of the E (enhancement) type connected at the first terminal to this reference voltage source 61; 63 a MOS transistor of the E type connected at the first terminal to the second terminal of this MOS transistor 62; and 64 a capacitor connected at the first terminal to the connection point of both the MOS transistors. The second terminal of MOS transistor 63 is connected to the output terminal 65 for outputting the stepped-up voltage. Control pulse CP is applied to the second terminal of capacitor 64 and the gate of MOS transistor 63. Control pulse $\overline{CP}$ is applied to the gate of MOS transistor 62. At time t1 that control pulse CP is at "L" level or logical low, MOS transistor 62 is turned on, MOS transistor 63 is turned off, and capacitor 64 is charged by reference voltage VREF of reference voltage source 61 through MOS transistor 62. At time t2 that control pulse CP is at "H" level or logical high, MOS transistor 62 is turned off, MOS transistor 63 is turned on, the voltage at output terminal 65 is equal to the sum of reference voltage VREF and the peak value of control pulse CP.

It is a common practice that the power source VDD voltage or a reference voltage generating circuit using MOS transistors is used for the reference voltage source 61 used for voltage step-up circuit 59.

A specific example of the reference voltage generating circuit of this type is shown in FIG. 5, for example. The arrangements of the reference voltage generating circuits shown in FIGS. 7 and 8 are modifications of the FIG. 5 circuit. In the circuit of FIG. 5, two MOS transistors 66 and 67 of the depletion type (D type) are connected in series between the VDD voltage applying point and the VSS voltage applying point. The gates of these transistors are connected to the drains thereof. Reference voltage VREF is output from the series connection point of these transistors.

The conductivity type of D type MOS transistors 66 and 67 in the reference voltage generating circuit shown in FIG. 5 are the same as that of a D type MOS transistor made up of reset gate electrode 53, floating diffusion region 50, and drain region 52. Therefore, the threshold voltage VTH of each of these transistors is negative in polarity. The MOS transistor 54 of output circuit 56 is of the E type, and its threshold voltage is positive.

If the reference voltage generating circuit arranged as shown in FIG. 5 is used for the reference voltage source of the voltage step-up circuit of FIG. 4, some problems occur. The problems will be discussed below. To obtain a wide dynamic range DR of the CTD output signal, it is only needed that the potential PD formed in the semiconductor region under drain region 52 is increased by increasing the stepped-up voltage from voltage step-up circuit 59. If the bias voltage VFD in floating diffusion region 50 is set to excess the sum of the power source VDD voltage and the threshold voltage VTHE of transistor 54 (VDD+VTHE), transistor 54 operates in the nonsaturation region, so that the linearity of the output signal is damaged. Therefore, the upper limit of the stepped-up voltage in voltage step-up circuit 59 is equal to a maximum voltage allowing the linearity of the output signal to be kept, and can be mathematically expressed by $$|VTHD|<VFD<VDD+VTHE \quad (5)$$

where, $$|VTHD|=PnL\approx PG$$

Voltage VTHD and VTHE vary as the process parameters in the device manufacturing stage, but their variations are a little for the reason that the reference voltage generating circuit of FIG. 5 uses the same conductivity type MOS transistors. Therefore, in the voltage step-up circuit of FIG. 4, the stepped-up voltage VGG is kept approximately constant against the variation of the process parameters. As a result, the operating range of bias voltage VFD is influenced by the process parameter variations, under the rule of the relation (5). Specifically, when the absolute value of threshold voltage VTHD is large, the lower limit margin of VFD is narrow, while when it is small, the upper limit margin of VFD is narrow. Therefore, when the absolute value VTHD is large, the dynamic range DR is narrow. When it is small, the MOS transistor 54 of output circuit 56 is saturated. Stepped-up voltage VGG must be set to be low. Also in this case, the dynamic range DR is small.

As described above, in the output circuit of the conventional CTD, the margin of the maximum amplitude range of the signal in the floating diffusion region necessary for keeping the linearity of the output signal is narrow under influence of the process parameters, particularly the threshold voltage of the depletion type MOS transistor.

SUMMARY OF THE INVENTION

Accordingly, an object of this invention is to provide a charge transfer device in which a margin of the maximum amplitude range of the signal in the floating diffusion region may be set to be relatively wide against some degree of variation of the process parameters, and under a predetermined power source voltage the output signal obtained is wide in the dynamic range, and good in the linearity and S/N performances.

According to a first aspect of this invention, there is provided an output circuit for a charge transfer device comprising: a voltage step-up circuit formed on a charge transfer device chip, the voltage step-up circuit generating a voltage whose absolute value is larger than a power source voltage of the output circuit for converting a quantity of charge in a floating region into a voltage, and supplying the generated voltage as a reset voltage to a drain region, and a reference voltage generating circuit of the voltage step-up circuit being made up of a MOS transistor of the same conductivity type as that of a MOS transistor of a reset means, and another MOS transistor of the same conductivity type as that of a MOS transistor for the output circuit.

According to a second aspect of this invention, there is provided a charge transfer device comprising: a floating diffusion region formed on a semiconductor substrate, signal charges being transferred to the floating diffusion region from a charge transfer section; a drain region for discharging unnecessary charges when receiving a reset voltage; a reset gate electrode for controlling the discharge of the stored charges of the floating diffusion region into the drain region, according to a reset pulse; voltage generating means for generating a voltage equal to a potential, the potential being a predetermined potential by "α" lower than a potential formed under the reset gate electrode when the stored charges of the floating diffusion region are discharged into the drain region; voltage step-up means for stepping up a predetermined voltage and for supplying the stepped-up voltage as a reset voltage to the drain region; and comparison/control means for generating an error voltage equal to a difference between the output voltage of the voltage generating means and the stepped-up voltage, and for controlling the voltage step-up operation by the step-up means according to the error voltage.

According to a third aspect of this invention, there is provided a charge transfer device comprising: a floating diffusion region formed on a semiconductor substrate, signal charges being transferred to the floating diffusion region from a charge transfer section; a drain region for draining unnecessary charges when receiving a reset voltage; a reset gate electrode for controlling the discharge of the stored charges of the floating diffusion region into the drain region, according to a reset pulse; reference voltage generating means for generating a reference voltage equal to a potential when receiving a predetermined voltage; voltage step-up means for stepping up the output voltage of the reference voltage generating circuit, and supplying the stepped-up voltage as a reset voltage to the drain region; and the stepped-up voltage being relatively lower than a potential formed under the reset gate electrode when the stored charges of the floating diffusion region are discharged into the drain region.

With the first feature, the output voltage of the reference voltage generating circuit follows up variations of the process parameters. The potential in the floating diffusion region quickly and exactly follows up the process parameter variations, increasing an effective variation range of the potential. The dynamic range of the output signal of the CTD is wide within some tolerable variation of the process parameters. The linearity and S/N performances of the CTD output circuit are improved, so that a large output signal can be obtained.

With the second and third features, the stepped-up voltage from the voltage step-up circuit, which is supplied as a reset voltage to the drain region, is controlled according to the process parameter variations, particularly a variation of the threshold voltage of the depletion type MOS transistor. The result is that the reset voltage well follows up the process parameter variations, the dynamic range of the output signal is always kept wide, and the output signal of good linearity and good S/N performance can be obtained.

BRIEF DESCRIPTION OF THE DRAWINGS

FIGS. 10 through 13 are circuit diagrams of the reference voltage generating circuits, which may be used in the charge transfer device according to an embodiment of this invention;

FIG. 14 is a circuit diagram of a voltage step-up circuit in a charge transfer device according to the embodiment of this invention;

FIG. 15 shows a graph showing a potential profile of the FIG. 14 step-up circuit;

FIG. 18 graphically shows a potential profile of the FIG. 17 circuit; and

FIGS. 19 and 20 are circuit diagrams of other step-up circuits.

DETAILED DESCRIPTION OF THE PREFERRED EMBODIMENTS

Figure 1:
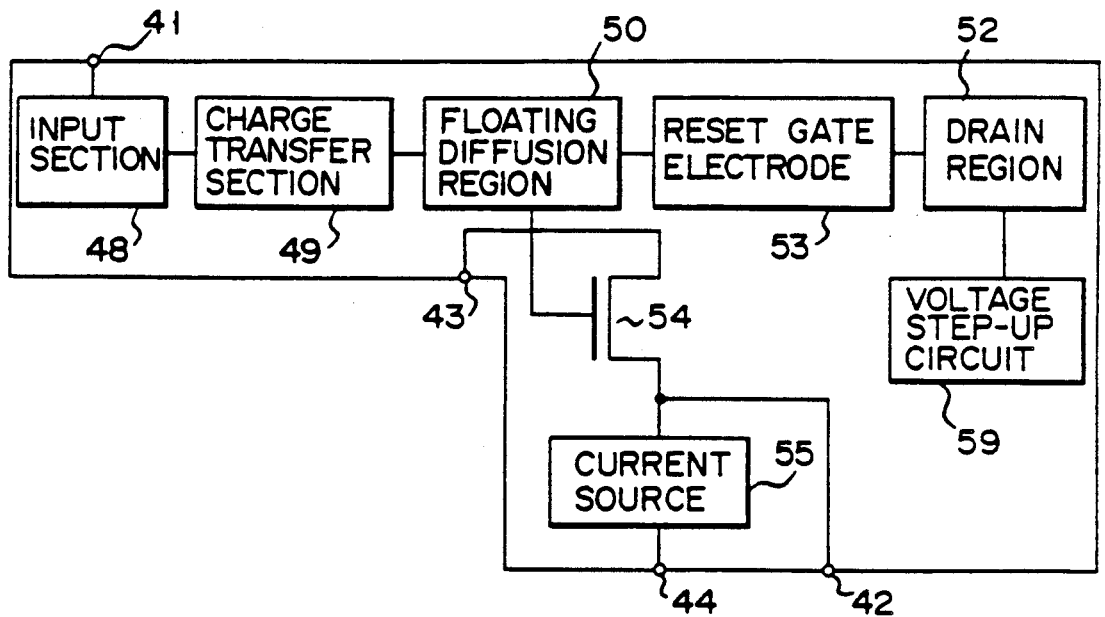
FIG. 1 shows a block diagram of a charge transfer device with a voltage step-up circuit.
Figure 2:
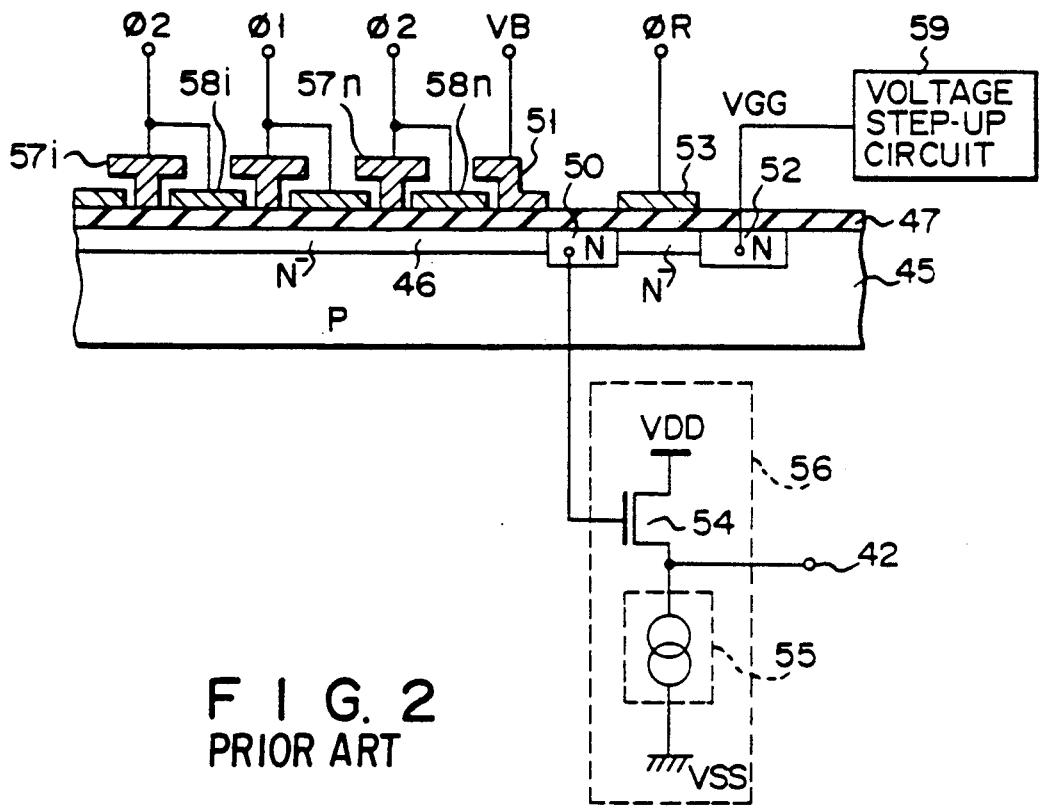
FIG. 2 shows a sectional view of the FIG. 1 device.
Figure 10:
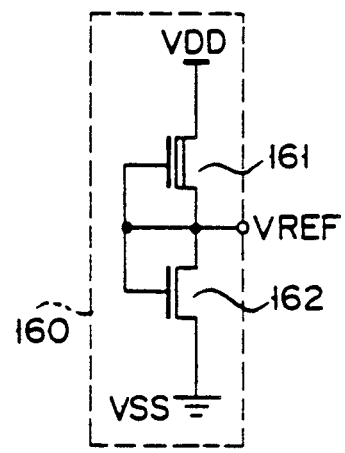

FIG. 10 shows a circuit arrangement of reference voltage generating circuit 160 used as reference potential voltage source 61 of the voltage step-up circuit 59 (e.g., the voltage step-up circuit shown in FIG. 4) in the CTD output circuit, which was described referring to FIG. 1. This reference voltage generating circuit 160 is made up of D type MOS transistor 161 and E type MOS transistor 162, which are connected in series between a VDD power source node and a VSS power source node. In transistor 161, the gate and source are interconnected, and in transistor 162 the drain and source are interconnected. The connection point of these transistors 161 and 162 is used as an output node of reference voltage VREF. D type MOS transistor 161 is of the same conductivity type as that of the MOS transistor making up the reset means (denoted as 53 in FIG. 1) of the CTD, and operates in the saturation region. E type MOS transistor 162 is of the same conductivity type as that of the output circuit MOS transistor (54 in FIG. 1) connected at the gate to the floating diffusion region (50 in FIG. 1) of the CTD. This transistor also operates in the saturation region.

The reference voltage output from the reference voltage generating circuit can be mathematically expressed by $$VREF = \frac{|VTHD| + \sqrt{\beta 62/\beta 61} \times VTHE}{\sqrt{\beta 62/\beta 61} + |KD|} \tag{6}$$

where
β61: β of D type transistor 161,
β62 : β of E type transistor 162,

VTHD: threshold voltage of transistor 161,
VTHE: threshold voltage of transistor 162,
KD: back bias effect of D type transistor 161, and
KD=ΔVTHD/ΔVREF.
If VTHE=IV, VTHD=−6V, |KD|=0.2, and $$\sqrt{\beta 62/\beta 61} = 2.0,$$

then VREF=3.64V. If the process parameter variations cause VTHE=1±0.4V and VTHD=−6±1V, (1) When VTHE and |VTHD| have both maximum values, VTHE=1.4V, and VTHD=−7V and VREF=4.45V, and (2) When VTHE and |VTHD| have both minimum values, VTHE=0.6V, and VTHD=−5V and VREF=2.82V.

Figure 4:
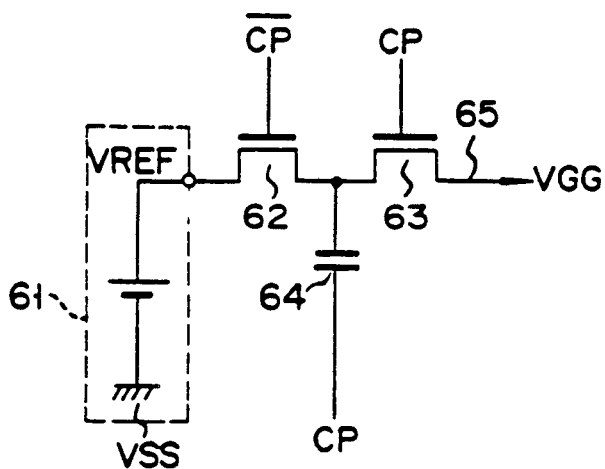
FIG. 4 is a circuit diagram showing the detail of the voltage step-up circuit.
Figure 5:
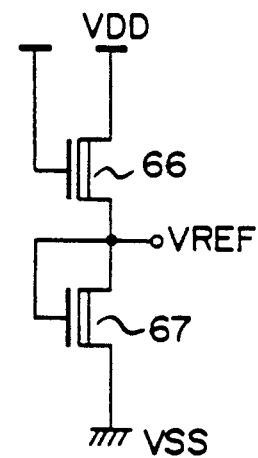
FIG. 5 shows a circuit diagram showing the detail of a reference voltage generating circuit.
Figure 6:
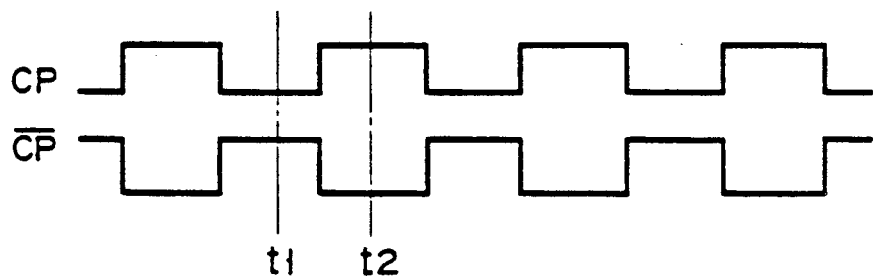
FIG. 6 shows a set of waveforms of clock pulses applied to the FIG. 4 circuit.
Figure 7:
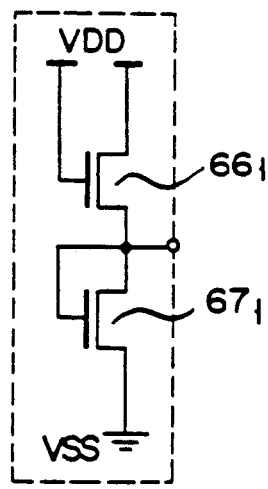
FIGS. 7 and 8 are circuit diagrams showing the details of other reference voltage generating circuit.
Figure 8:
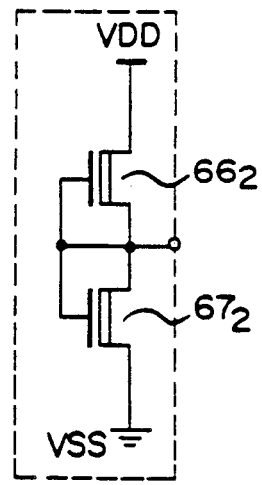

The process parameters dependency of reference voltage output VREF affects the stepped-up voltage (reset voltage VGG) from the voltage step-up circuit of FIG. 4. Therefore, in the case of the (1) above where absolute value |VTHD| is large, VGG is high, and as seen from the relation (5), the lower limit margin of the bias voltage VFD of the signal in the floating diffusion region 50 increases. In the case of the (2) above where threshold voltage VTHE is small, voltage VGG is small and the upper limit margin of voltage VFD increases. This indicates that the follow-up performance of the potential in floating diffusion region 50 for the process parameters is improved.

Figure 9:
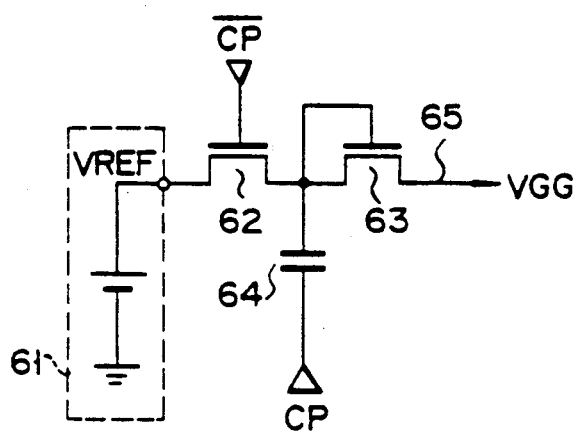
FIG. 9 is a circuit diagram showing the detail of another voltage step-up circuit.

When the reference voltage generating circuit 160 of FIG. 10 is applied for the reference voltage source 61 in the FIG. 9 step-up circuit, minor modification is needed. Specifically, under the typical process conditions, reference voltage VREF must be increased by a voltage value amounting to the threshold voltage VTHE (=1V) of the MOS diode 63 in the voltage step-up circuit of FIG. 9. To this end, the β values of MOS transistors 161 and 162 are changed. If VTHE=1V, VTHD=−6V, and |KD|=0.2V, and $$\sqrt{\beta 62/\beta 61} = 1.39,$$

the relation (6) gives VREF=4.65V. The stepped-up voltage VGG of the voltage step-up circuit of FIG. 9 is 3.65V (=VREF−VTHE). This figure is the result of subtraction of the threshold value 1V of the MOS diode from VREF figure, or 4.65V, and is equal to the stepped-up voltage VGG of the FIG. 4 step-up circuit. When the threshold voltages VTHE and VTHD vary to 1.4V and −7V, reference voltage VREF=5.63V, and the stepped-up voltage VGG is 4.23V (=VREF−VTHE). When VTHE=0.6V and VTHD=−5V, VREF=3.67V, and the stepped-up voltage VGG is 3.07V (=VREF−VTHE). The process parameter dependency of the reference voltage VREF affects the stepped-up voltage (reset voltage VGG) output from the voltage step-up circuit of FIG. 9. As a result, the potential in floating diffusion region 50 quickly and exactly follows up the process parameters.

A modification of the reference voltage generating circuit will be described referring to FIGS. 11 through 13. Reference voltage generating circuit 170 shown in FIG. 11 is different from the reference voltage generating circuit 160 shown in FIG. 10 mainly in that the gate of D type MOS transistor 161 is connected to the power source VDD node, and this transistor 161 is operated in a nonsaturation region. Like portions are designated by like symbols in FIG. 1. When this reference voltage generating circuit 170 is used for the CTD, substantially the same effects as those when the reference voltage generating circuit 160 of FIG. 1 is used may be obtained.

The reference voltage generating circuit 180 shown in FIG. 12 follows. Major differences of the FIG. 12 circuit from the FIG. 10 circuit reside in that the gate of E type MOS transistor 162 is disconnected from the reference voltage output node, to give the voltage VG1 of this gate the process parameter dependency. More specifically, E type MOS transistor 181 whose gate and drain are interconnected and D type MOS transistor 182 whose gate and source are interconnected, are connected in series between the power source VDD node and the power source VSS node. The interconnection point of these transistors 181 and 182 is connected to the gate of E type MOS transistor 162. In this arrangement, when the threshold voltage VTHE of E type MOS transistor 181 is large and the threshold voltage VTHD of D type MOS transistor. 182 is small, gate voltage VG1 is small. Therefore, the trans-conductance gm of E type MOS transistor 162 is reduced by a value amounting to the increase of threshold voltage VTHE and the decrease of gate voltage VG1. The same thing is true for the reverse cage. Therefore, the process parameter follow-up performance of the FIG. 12 reference voltage generating circuit is further improved when compared with that of the FIG. 10 circuit. Alternatively, the gate of D type MOS transistor 161 may be connected to the power source VDD node. Substantially the same advantageous effects may be obtained.

The reference voltage generating circuit 190 of FIG. 13 will be described. When comparing with the reference voltage generating circuit of FIG. 12, this circuit is so arranged that the gate of D type MOS transistor 161 is disconnected from the reference voltage output node, the process dependency is given to the voltage VG2 at this gate. In more particular, the reference voltage generating circuit 160 shown in FIG. 10 is used as the bias voltage source. The bias voltage output node is connected to the gate of D type MOS transistor 161. In this case, when the threshold voltage VTHD of the D type MOS transistor 161 in bias voltage source 160 is small and the threshold voltage VTHE of E type MOS transistor 162 is large, gate voltage VG2 becomes large. Therefore, the trans-conductance gm of the D type MOS transistor 161 in reference voltage generating circuit 190 is increased by a value amounting to the decrease of the threshold voltage VTHD and the increase of gate voltage VG2. The reverse is true. Consequently, the process parameter follow-up performance of this circuit of FIG. 13 is further improved. If necessary, the FIG. 11 reference voltage generating circuit 170 or the FIG. 12 reference voltage generating circuit 180 may be used for bias voltage source 160. Additionally, in the reference voltage generating circuit 190 of FIG. 13, a plurality of the circuit portions other than bias voltage source 160 are provided. These circuit portions are connected in a cascade fashion that the output voltage of one stage is used for the bias voltage of the succeeding stage.

Another embodiment of a charge transfer device according to this invention will be described.

In this embodiment, a circuit arranged as shown in FIG. 14 is used in place of the voltage step-up circuit in FIG. 1.

In the figure, voltage generating circuit 10 equivalently detects a potential in the semiconductor region under reset gate electrode 53, and generates a voltage, which is by "α" lower than the detected potential, but depends on the detected potential. Voltage step-up circuit 20 steps up a predetermined voltage with respect to a reference voltage, and supplies the stepped-up voltage as reset voltage VGG to drain region 52. Comparison/control circuit 30 generates an error voltage, which depends on a difference between the voltage generated by voltage generating circuit 10 and the stepped-up voltage from voltage step-up circuit 20, and controls the step-up operation of voltage step-up circuit 20 according to this error signal.

Voltage generating circuit 10 is comprised of voltage step-up circuit 11 for generating a constant voltage, D type MOS transistor 12 with the same structure as that of reset gate electrode 53, constant voltage source 13, and constant current source 14. Voltage step-up circuit 11 generates a constant voltage slightly high than a potential in the semiconductor region under the channel of MOS transistor 12, and supplies this constant voltage to the drain of transistor 12. The gate of transistor 12 is coupled with constant voltage source 13 which provides a voltage equal to high voltage VRH of reset pulse φR to be supplied to reset gate electrode 53. This transistor 12 is normally turned on. The source of transistor 12 is connected to constant current source 14. A voltage at this connection point of this source and constant current source 14 is supplied to comparison/control circuit 30.

Voltage step-up circuit 20 steps up a predetermined voltage to generate reset voltage VGG, and is constructed as shown in FIG. 14, for example.

Comparison/control circuit 30 is comprised of level shift circuit 31 for level shifting the voltage generated by voltage generating circuit 10, level shift circuit 32 for level shifting the stepped-up voltage from voltage step-up circuit 20, and comparator 33 for outputting an error voltage amounting to a difference between the output voltages from level shift circuits 31 and 32. The error voltage from comparator 33 is supplied as a control input signal to voltage step-up circuit 20. Voltage step-up circuit 20 steps up reference voltage VREF shown in FIG. 4, for example, according to this control input.

Figure 3:
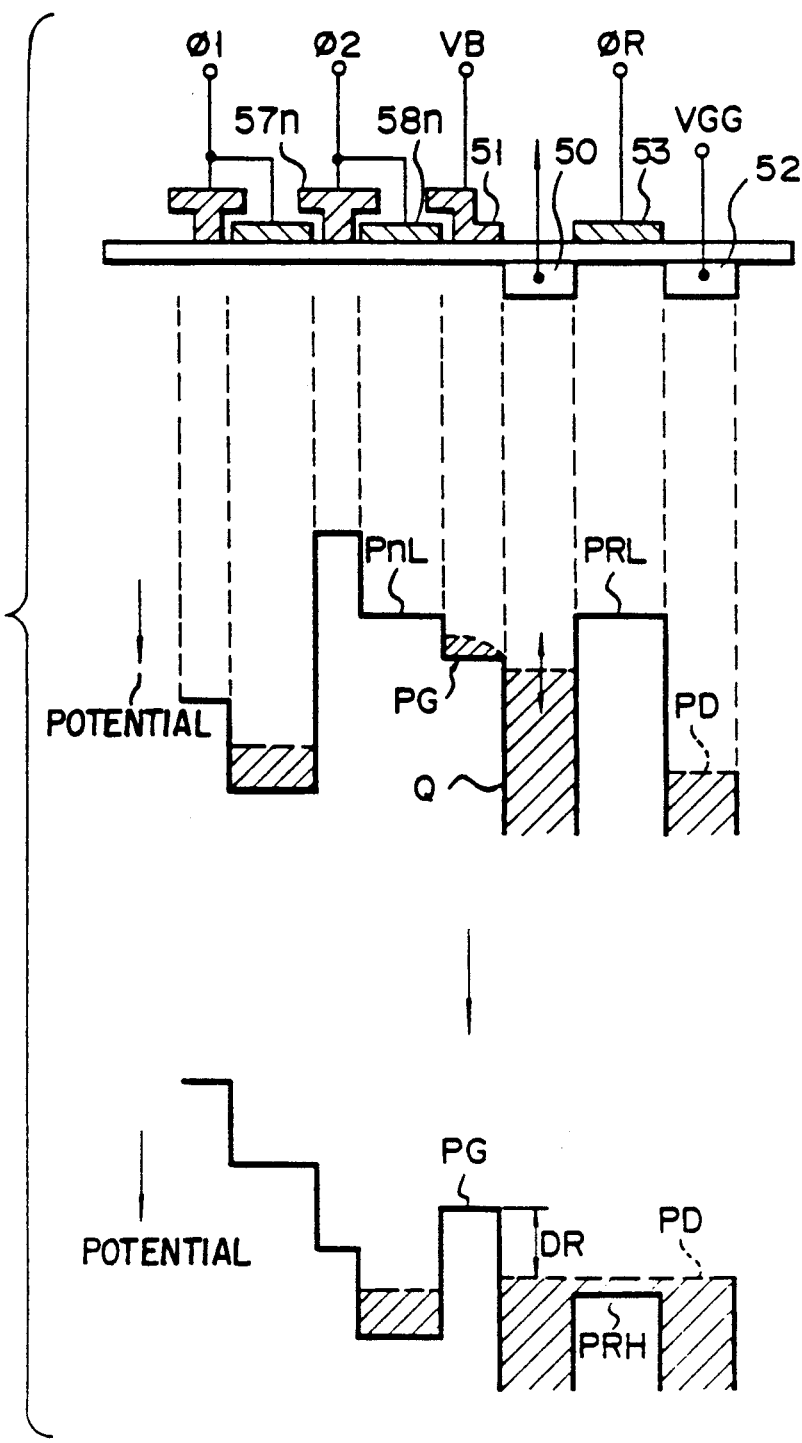
FIG. 3 shows a graph showing a potential profile of the charge transfer device shown in FIG. 2.

The operation of the circuit thus arranged will be described referring to a potential profile shown in FIG. 15. In voltage generating circuit 10, a constant voltage from voltage step-up circuit 11 has been applied to the drain region 15 of MOS transistor 12. Then, a constant potential Pd has been generated in the semiconductor region under the drain region. Constant voltage VRH from constant voltage source 13 has been applied to the gate of MOS transistor 12. A potential PRH equal to that for reset gate electrode 53 has been generated in the semiconductor region under that gate. The source region 16 of transistor 12 is connected to constant current source 14. Current IO from this constant current source 14 flows through the path between the drain and source of this transistor. The potential in source region 16 of transistor 12 is set at (PRH−α) which is a difference between the potential PRH under the channel region and a potential drop "α" caused by current IO. A voltage amounting to this value is generated in source region 16. Current IO is so adjusted that the value amounting to the value "α" is equal to a margin at the time of reset, which is a difference between a high level potential PRH in the semiconductor region under reset gate 53 in FIG. 3, and the potential PD in drain region 52.

Since the voltage from voltage generating circuit 10 and voltage step-up circuit 20 is higher than the power source voltage used by voltage step-up circuit 20 and comparison/control circuit 30, both voltages are level shifted by level shift circuits 31 and 32, respectively, and applied to comparator 33. In turn, comparator 33 produces an error voltage amounting to a difference between them. The voltage step-up operation of voltage step-up circuit 20 is controlled according to the error voltage. When the output levels of these circuits 31 and 32 are coincident with each other, the stepped-up voltage VGG of voltage step-up circuit 20 is settled down.

Therefore, if the potential PG in the semiconductor region under output gate electrode 51 is set to substantially be equal to that PnL under the final stage transfer electrode 58n, the dynamic range DR can be kept almost constant even if the value of PnL, or the threshold voltage $|VTHD|$ of of D type MOS transistor, varies due to the process parameter variations.

As seen from the foregoing, the stepped-up reset voltage is applied to the drain region 52, in order to widen the dynamic range of the output circuit. Because of this feature, good linearity and S/N performances can be obtained under a predetermined power source voltage. Further, a high level output signal can be obtained. Furthermore, the CTD according to this embodiment is so arranged that the potential in the semiconductor region under reset gate electrode 53 is equivalently detected, and the reset voltage VGG is made to quickly and exactly follow up the process parameter variations, particularly a variation of the threshold voltage $|VTHD|$ of the D type MOS transistor. This circuit arrangement substantially fixes the output dynamic range DR.

Figure 16:
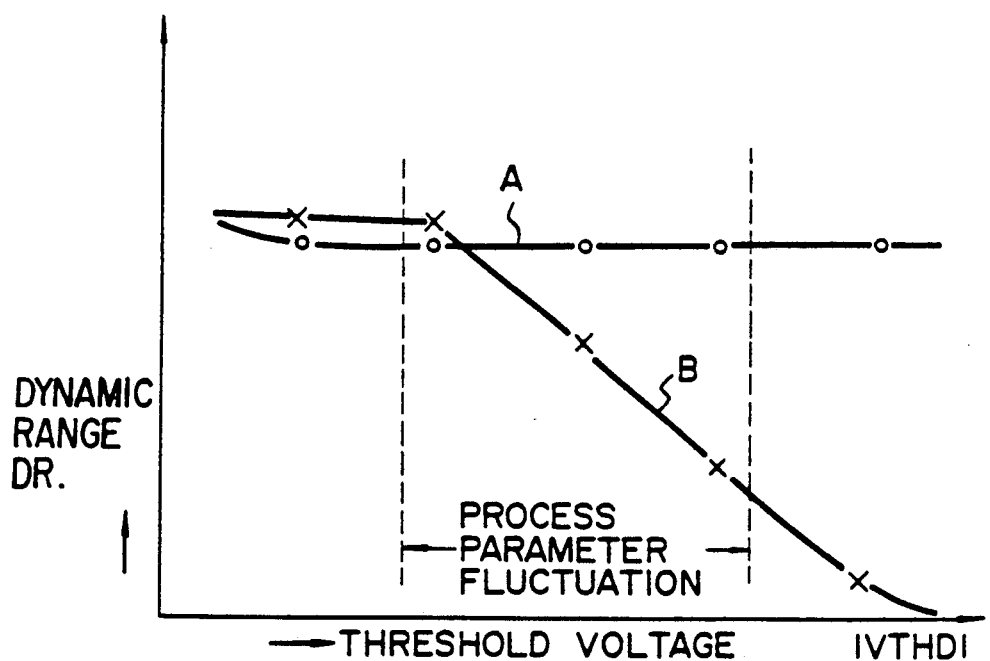
FIG. 16 graphically shows characteristic curves of dynamic ranges DR versus threshold voltages $|VTHD|$.

FIG. 16 shows a variation of dynamic range DR vs. a variation of the threshold voltage $|VTHD|$ due to the process parameters variations. In the figure, curve A shows a dynamic range DR variation of the CTD according to this embodiment, and curve B shows that of the conventional CTD in which the reset voltage VGG is fixed. As shown, in the case of curve B, dynamic range DR considerably varies within the range of the process parameter variations of voltage $|VTHD|$, and the dynamic range DR is too small for practical use in the high area of voltage $|VTHD|$. On the other hand, in this embodiment, the dynamic range DR is kept substantially constant within the range of the process parameter variations. Curve B varies little in the region of low voltage $|VTHD|$. This corresponds to a condition PRH<PD in FIG. 3. Under this condition, it is known that the noise component increases. It is therefore unadvisable to use the CTD under this condition.

It should be understood that this invention is not limited to the above specific embodiments, but also may variously be changed within the scope and spirits of this invention. In the above-mentioned embodiment, voltage generating circuit 10 is so arranged that in generating the voltage corresponding to the potential (PRH−α), which is lower than the potential PRH in the semiconductor region under reset gate electrode 53 by "α", it is generated by only constant current source 14. Alternatively, the voltage of constant voltage source 13 applied to the gate of MOS transistor may be set to be lower than high voltage VRH of reset pulse φR to actually be applied to reset gate electrode 53. If so done, a further wide reset margin can be secured. This may be realized by adjusting the channel width W of MOS transistor 12.

The voltage step-up circuit 20 may be any type of circuit if it can control its step-up operation of voltage according to the error voltage from comparison/control circuit 30. For example, it may be so arranged that reference voltage VREF is always constant, and the stepped-up voltage may be controlled by varying the pulse width of the control pulse CP, which is made according to the error voltage derived from comparison/control circuit 30.

Figure 17:
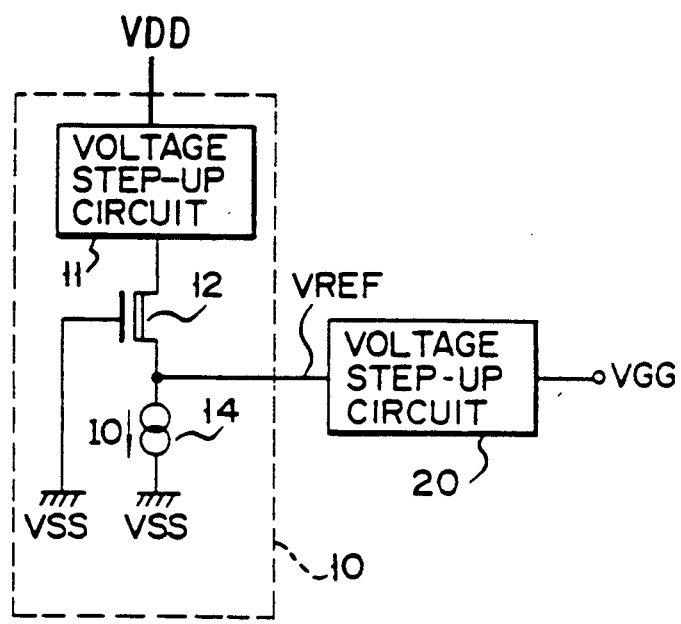
FIG. 17 is a circuit diagram of another step-up circuit.

Another embodiment of a CTD according to this invention will be described. This embodiment employs a circuit arranged as shown in FIG. 17, in place of the voltage step-up circuit in FIG. 1.

In the figure, voltage generating circuit 10 generates a voltage equal to the potential generated in the semiconductor region under the reset electrode when a low level voltage is applied to reset gate electrode 53. Voltage step-up circuit 20 steps up a predetermined voltage and adds the stepped-up voltage to the output voltage of the voltage generating circuit, and applies the stepped-up voltage as the reset voltage VGG to drain region 52.

Voltage generating circuit 10 is made up of voltage step-up circuit 11 for generating a constant voltage, D type MOS transistor 12 with the same structure as that of reset gate electrode 53, and constant current source 14. Voltage step-up circuit 11 generates a constant voltage that is slightly higher than the potential generated in the semiconductor region under the channel of MOS transistor 12, and supplies the constant voltage to the drain of transistor 12. The gate of transistor 12 is coupled for reception with ground potential VSS equal to the low voltage VRL of reset pulse φR to be supplied reset gate electrode 53. This transistor 12 is normally in a conductive state. The source of transistor 12 is coupled with constant current source 14. A voltage appearing at the connection point of this source and constant current source 14 is supplied to voltage step-up circuit 20.

This circuit 20 steps up a predetermined voltage with respect to a reference voltage, to generate reset voltage VGG, and has a structure similar to that shown in FIG. 4.

To be more specific, the output voltage VREF of voltage generating circuit 10 is used for the reference voltage. The circuit is arranged so that a variation of the reference voltage VREF affects the output voltage VGG.

The operation of the CTD thus arranged will be described referring to the potential profile in FIG. 18. In voltage generating circuit 10, the drain region 15 of MOS transistor 12 is coupled for reception with a constant voltage derived from bootstrap circuit 11, and a constant potential Pd is generated in the semiconductor region under the drain region 15. Further, the gate of MOS transistor 12 is coupled with ground potential VSS. Generated in the semiconductor region thereunder is a potential PRL when a low level voltage is applied to reset gate electrode 53. The source region 16 of transistor 12 is connected to constant current source 14, and current IO from constant current source 14 flows through the path between the drain and source. Therefore, the potential in the source region 16 of this transistor 12 is set to be a difference between the potential PRL in the channel region and a decreased potential "β" of the potential, which is caused by the current IO flow. The difference is given by (PRL−β). The current IO is so adjusted that the value correction to this decreased value "β" is equal to a margin at the time of reset, which is the difference between the high level potential PRH formed in the semiconductor region under reset gate electrode 53 in FIG. 3, and the potential PD in drain region 52.

In FIG. 18, a fixed resistor may be used for constant current source 14, if necessary.

The voltage step-up circuit 11 as one of the components constituting voltage generating circuit 10 is used for supplying a voltage higher than voltage PRH to drain region 15. If the required voltage may be obtained without the voltage step-up operation, use of the maximum power source voltage suffices.

Therefore, if the potential PG in the semiconductor region under output gate electrode 51 is set to substantially be equal to that PnL under the final stage transfer electrode 58n, the dynamic range DR can be kept almost constant even if the value of PnL, or the threshold voltage |VTHD| of of D type MOS transistor, varies due to the process parameter variations.

As seen from the foregoing, the stepped-up reset voltage is applied to the drain region 52, in order to widen the dynamic range of the output circuit. Because of this feature, good linearity and S/N performances can be obtained under a predetermined power source voltage. Further, a high level output signal can be obtained. Furthermore, the CTD according to this embodiment is so arranged that the potential in the semiconductor region under reset gate electrode 53 is equivalently detected, and the reset voltage VGG is made to quickly and exactly follow up the process parameter variations, particularly a variation of the threshold voltage |VTHD| of the D type MOS transistor. This circuit arrangement substantially fixes the output dynamic range DR.

FIG. 16 shows a variation of dynamic range DR vs. a variation of the threshold voltage |VTHD| due to the process parameters variations. In the figure, curve A shows a dynamic range DR variation of the CTD according to this embodiment, and curve B shows that of the conventional CTD in which the reset voltage VGG is fixed. As shown, in the case of curve B, dynamic range DR considerably varies within the range of the process parameter variations of voltage |VTHD|, and the dynamic range DR is too small for practical use in the high area of voltage |VTHD|. On the other hand, in this embodiment, the dynamic range DR is kept substantially constant within the range of the process parameter variations. Curve B varies little in the region of low voltage |VTHD|. This corresponds to a condition PRH<PD in FIG. 3. Under this condition, it is known that the noise component increases. It is therefore unadvisable to use the CTD under this condition.

It should be understood that this invention is not limited to the above specific embodiments, but also may variously be changed within the scope and spirits of this invention. In the above-mentioned embodiment, voltage generating circuit 10 is so arranged that the voltage corresponding to the potential (PRH−β), which is lower than the potential PRH in the semiconductor region under reset gate electrode 53 by "β" is generated in order to obtain the reset margin. Alternatively, the ground potential VSS applied to the gate of MOS transistor 12 may be set to be lower than low voltage VSS of reset pulse φR to actually be applied to reset gate electrode 53. If so done, a further wide reset margin can be secured. This may be realized by adjusting the channel width W of MOS transistor 12.

The voltage step-up circuit 20 may be any type of circuit if it can control its step-up operation of voltage according to the error voltage from comparison/control circuit 30. For example, it may be so arranged that reference voltage VREF is always constant, and the stepped-up voltage may be controlled by varying the pulse width of the control pulse CP, which is made according to the error voltage derived from comparison/control circuit 30.

Turning now to FIG. 19, there is shown another embodiment of a CTD according to this invention. This embodiment is equivalent to such a circuit that a voltage follower circuit made up of operational amplifier 33, for example, is inserted between voltage generating circuit 10 and voltage step-up circuit 20 in FIG. 17. The output signal of voltage generating circuit 10 enters the voltage follower circuit, and reference voltage VREF appears at the voltage follower circuit output 24. This voltage is applied to the voltage step-up circuit. The remaining circuit arrangement is the same as that of FIG. 17.

A circuit arrangement shown in FIG. 20 is arranged so as to have the same object as that of the FIG. 19 circuit. The reference voltage VREF of potential detecting voltage generating circuit 17 in FIG. 19 is substantially equal to a voltage formed by dividing voltage 18 (equal to the output voltage VREF in FIG. 19) slightly lower than the detected potential by a ratio of trans-conductance gm of D type MOS transistors 22 and 32. In this case, the gm ratio is so selected that voltage VREF is higher than the values within the operating region of the voltage follower. The voltage contributing the stepped-up voltage is equal to a voltage as the difference between an actually varied potential and a voltage as reduced by the gm ratio of transistors 22 and 32.

As described above, according to this invention, even if a voltage variation due to process parameter variations is within a tolerable range, a margin of the maximum amplitude range of the signal in the floating gate region may be set to be wide. Therefore, a charge transfer device according to this invention may have good linearity, good S/N ratio, and a wide dynamic range.

What is claimed is:

1. A charge transfer device comprising:

a floating diffusion region formed on a semiconductor substrate, signal charged being transferred to said floating diffusion region from a charge transfer section;

a drain region for discharging unnecessary charges when receiving a reset voltage;

a reset gate electrode for controlling the discharge of the stored charges of said floating diffusion region into said drain region, in accordance with a reset pulse;

voltage generating means for generating a voltage having a potential which is lower by "α" volts than a potential formed under said reset gate electrode when the stored charges of said floating diffusion region are discharged into said drain region, wherein "α" is a value equal to a difference between the potential of said drain region and the potential formed under said reset gate electrode when the stored charges of said floating diffusion region are discharged into said drain region;

voltage set-up means for stepping up a predetermined voltage and for supplying the stepped-up voltage as said reset voltage to said drain region; and comparison/control means for generating an error voltage equal to a difference between the output voltage of said voltage generating means and said stepped-up voltage, and for controlling the voltage step-up operation by said step-up means in accordance with said error voltage.

2. A charge transfer device comprising:

a floating diffusion region formed on a semiconductor substrate, signal charges being transferred to said floating diffusion region from a charge transfer section;

a drain region for draining unnecessary charges when receiving a reset voltage;

a reset gate electrode for controlling the discharge of the stored charges of said floating diffusion region into said drain region, in accordance with a reset pulse;

reference voltage generating means for generating a reference voltage;

voltage step-up means for stepping up the output voltage of said reference voltage generating means, and supplying the stepped-up voltage as said reset voltage to said drain region, said step-up voltage being relatively lower than a potential formed under said reset gate electrode when the stored charges of said floating diffusion region are discharged into said drain region.

* * * * *

UNITED STATES PATENT AND TRADEMARK OFFICE
CERTIFICATE OF CORRECTION

PATENT NO.  : 4,996,686
DATED  : February 26, 1991
INVENTOR(S)  : Shin-Ichi Imai et al.

It is certified that error appears in the above-identified patent and that said Letters Patent is hereby corrected as shown below:

In the Abstract, line 1, change "circuit" to --circuit--.

Claim 1, column 14, line 2, change "charged" to --charges--.

Claim 1, column 14, line 21, change "set-up" to --step-up--.

Signed and Sealed this

Twentieth Day of April, 1993

Attest:

MICHAEL K. KIRK

*Attesting Officer*  *Acting Commissioner of Patents and Trademarks*